United States Patent
Kataoka et al.

(10) Patent No.: US 11,476,113 B2
(45) Date of Patent: Oct. 18, 2022

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Ryota Kataoka, Toyama (JP); Hiroaki Hiramatsu, Toyama (JP); Kiyohisa Ishibashi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 18 days.

(21) Appl. No.: 17/021,738

(22) Filed: Sep. 15, 2020

(65) Prior Publication Data
US 2021/0082685 A1   Mar. 18, 2021

Related U.S. Application Data

(63) Continuation of application No. PCT/JP2019/036572, filed on Sep. 18, 2019.

(51) Int. Cl.
*H01L 21/02* (2006.01)
(52) U.S. Cl.
CPC .... *H01L 21/0228* (2013.01); *H01L 21/02167* (2013.01); *H01L 21/02312* (2013.01)
(58) Field of Classification Search
CPC .......... H01L 24/72; H01L 25/071; H01L 2924/10254; H01L 2924/10272; H01L 2924/1033; H01L 2924/1203; H01L 2924/13055; H01L 21/02208–02222;
(Continued)

(56) References Cited

U.S. PATENT DOCUMENTS 8,415,258 B2    4/2013  Akae et al.
2010/0190348 A1   7/2010  Akae et al.
2011/0076857 A1   3/2011  Akae et al.
(Continued)

FOREIGN PATENT DOCUMENTS

JP    2010-183069 A    8/2010
JP    2014-116626 A    6/2014
(Continued)

OTHER PUBLICATIONS

International Search Report and English Translation, PCT/JP2019/036572, dated Dec. 10, 2019, 6 pgs.
(Continued)

*Primary Examiner* — Julio J Maldonado
*Assistant Examiner* — Andre C Stevenson
(74) *Attorney, Agent, or Firm* — Volpe Koenig

(57) ABSTRACT

There is provided a technique having a process that includes forming a film, which contains a first element and a second element on a substrate by performing a cycle a predetermined number of times, the cycle sequentially performing: (a) supplying a first precursor gas containing the first element to the substrate in a process chamber; (b) supplying a second precursor gas, which contains the first element and has a pyrolysis temperature lower than a pyrolysis temperature of the first precursor gas, to the substrate; and (c) supplying a reaction gas, which contains the second element that is different from the first element, to the substrate.

18 Claims, 9 Drawing Sheets

|  | Sample 1 | Sample 2 | Sample 3 | Sample 4 | Sample 5 |
|---|---|---|---|---|---|
| $SiCl_4$ supply time (sec) | 60 | 60 | 60 | 60 | 60 |
| $Si_2Cl_6$ supply time (sec) | — | 1.5 | 4.5 | 9 | 18 |
| Average film thickness [Å] | 51.5 | 69.6 | 79.8 | 86.3 | 90.4 |
| RI | 1.922 | 1.990 | 2.003 | 2.004 | 2.014 |

(58) Field of Classification Search
CPC .......................... H01L 21/02271–0228; H01L 21/02123–0217
See application file for complete search history.

(56) References Cited

U.S. PATENT DOCUMENTS

| | | |
|---|---|---|
| 2012/0045905 A1 | 2/2012 | Akae et al. |
| 2014/0127887 A1* | 5/2014 | Kraus .................. C23C 16/303 438/478 |
| 2014/0220788 A1 | 8/2014 | Sano et al. |
| 2014/0235067 A1 | 8/2014 | Shimamoto et al. |
| 2016/0013042 A1 | 1/2016 | Hashimoto et al. |
| 2016/0024659 A1 | 1/2016 | Shimamoto et al. |
| 2017/0139360 A1 | 5/2017 | Nagai |
| 2017/0170004 A1* | 6/2017 | Harada ............. H01L 29/66795 |
| 2018/0033607 A1 | 2/2018 | Nakatani et al. |

FOREIGN PATENT DOCUMENTS

| | | |
|---|---|---|
| JP | 2015-185614 | 10/2015 |
| JP | 2016-18907 A | 2/2016 |
| JP | 2016-25262 A | 2/2016 |
| JP | 2017-97017 A | 6/2017 |
| JP | 2018-18896 A | 2/2018 |
| KR | 20110035935 A | 4/2011 |
| WO | 2013/054655 A1 | 4/2013 |

OTHER PUBLICATIONS

Singapore Search Report dated Nov. 18, 2021 for Singapore Patent Application No. 10202107865P.
Singapore Written Opinion dated Nov. 18, 2021 for Singapore Patent Application No. 10202107865P.
Korean Office Action dated Nov. 25, 2021 for Korean Patent Application No. 10-2020-7026142.

* cited by examiner

|  | Sample 1 | Sample 2 | Sample 3 | Sample 4 | Sample 5 |
|---|---|---|---|---|---|
| $SiCl_4$ supply time (sec) | 60 | 60 | 60 | 60 | 60 |
| $Si_2Cl_6$ supply time (sec) | — | 1.5 | 4.5 | 9 | 18 |
| Average film thickness [Å] | 51.5 | 69.6 | 79.8 | 86.3 | 90.4 |
| RI | 1.922 | 1.990 | 2.003 | 2.004 | 2.014 |

FIG. 9

| | Sample 6 | Sample 7 |
|---|---|---|
| $SiCl_4$ supply time (sec) | — | 60 |
| $Si_2Cl_6$ supply time (sec) | 9 | 9 |
| Top/Bottom ratio (%) | 88 | 95 |
| Range (%) | 15.5 | 8.0 |

# METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT international Application No. PCT/JP2019/036572, filed on Sep. 18, 2019, the entire contents of which are incorporated herein by reference.

TECHNICAL FIELD

The present disclosure relates to a method of manufacturing a semiconductor device, a substrate processing apparatus, and a recording medium.

BACKGROUND

As a process of manufacturing a semiconductor device, a process of forming a film on a substrate is often carried out.

SUMMARY

Some embodiments of the present disclosure provide a technique capable of improving the properties of a film formed on a substrate.

According to one embodiment of the present disclosure, there is provided a technique for forming a film, which contains a first element and a second element, on a substrate by performing a cycle a predetermined number of times, the cycle sequentially performing:
 (a) supplying a first precursor gas containing the first element to the substrate in a process chamber;
 (b) supplying a second precursor gas, which contains the first element and has a pyrolysis temperature lower than a pyrolysis temperature of the first precursor gas to the substrate; and
 (c) supplying a reaction gas, which contains the second element that is different from the first element, to the substrate.

BRIEF DESCRIPTION OF DRAWINGS

FIG. 9 is a table showing evaluation results of a film formed on the substrate.

DETAILED DESCRIPTION

<One Embodiment of the Present Disclosure>

One embodiment of the present disclosure will now be mainly described with reference to FIGS. 1 to 5 and 7A to 7C.

(1) Configuration of Substrate Processing Apparatus

Figure 1:
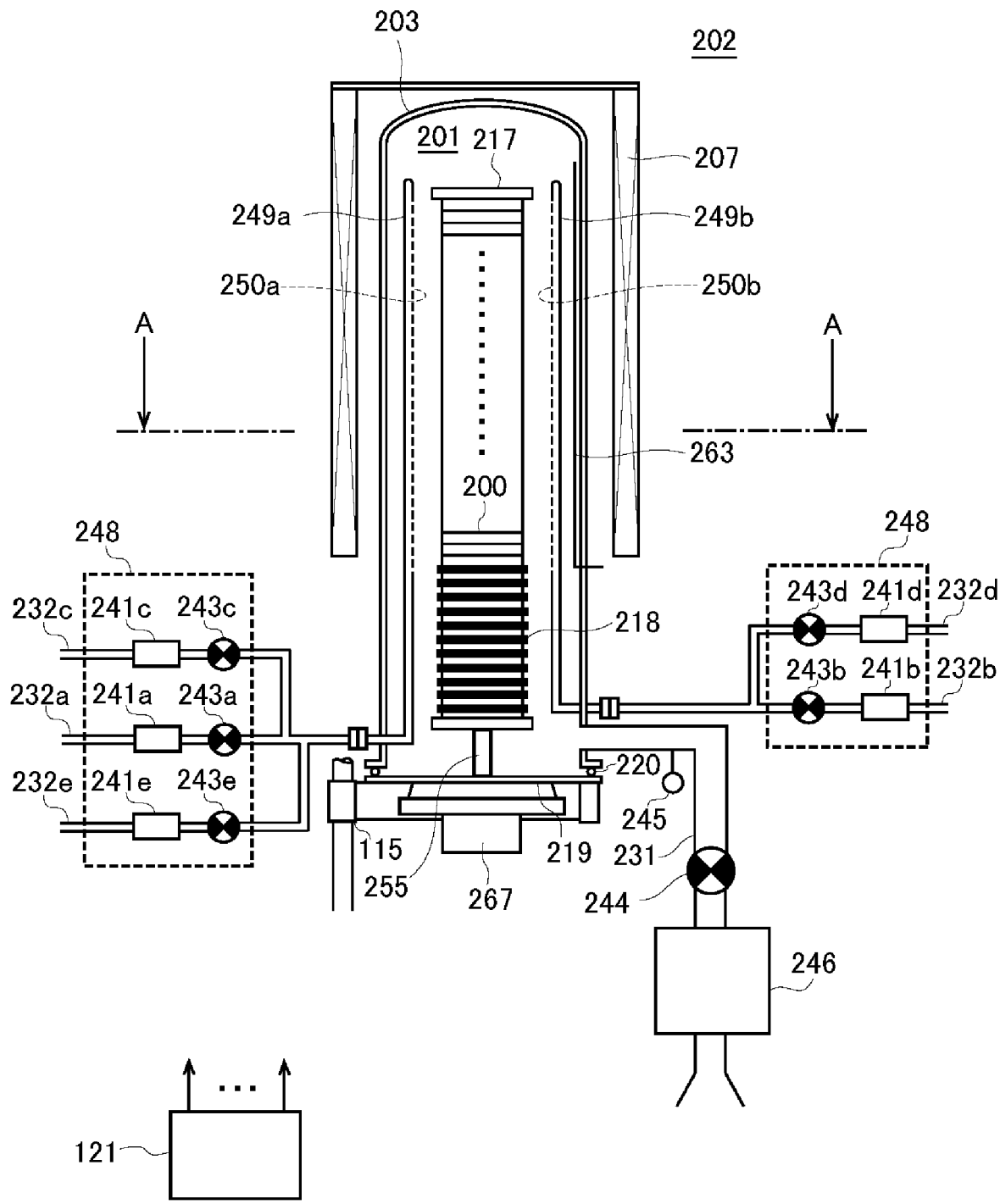
FIG. 1 is a schematic configuration view of a vertical process furnace of a substrate processing apparatus suitably used in an embodiment of the present disclosure, in which a portion of the process furnace is illustrated in a vertical cross-sectional view.

As illustrated in FIG. 1, a process furnace 20 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$), silicon carbide (SiC) or the like, and has a cylindrical shape with its upper end closed and its lower end opened. A process chamber 201 is formed in a hollow cylindrical portion of the reaction tube 203. The process chamber 201 is configured to be capable of accommodating wafers 200 as substrates. The wafers 200 are processed in the process chamber 201.

Nozzles 249a and 249b are installed in the process chamber 201 so as to penetrate through a lower sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed in the gas supply pipes 232a and 232b, respectively, sequentially from the upstream side of a gas flow. A gas supply pipe 232c is connected to the gas supply pipe 232a at the downstream side of the valve 243a. A MFC 241c and a valve 243c are installed in the gas supply pipe 232c sequentially from the upstream side of the gas flow. Gas supply pipes 232e and 232d are connected to the gas supply pipes 232a and 232b at the downstream sides of the valves 243a and 243b, respectively. MFCs 241e and 241d and valves 243e and 243d are installed in the gas supply pipes 232e and 232d from the upstream side of the gas flow, respectively.

Figure 2:
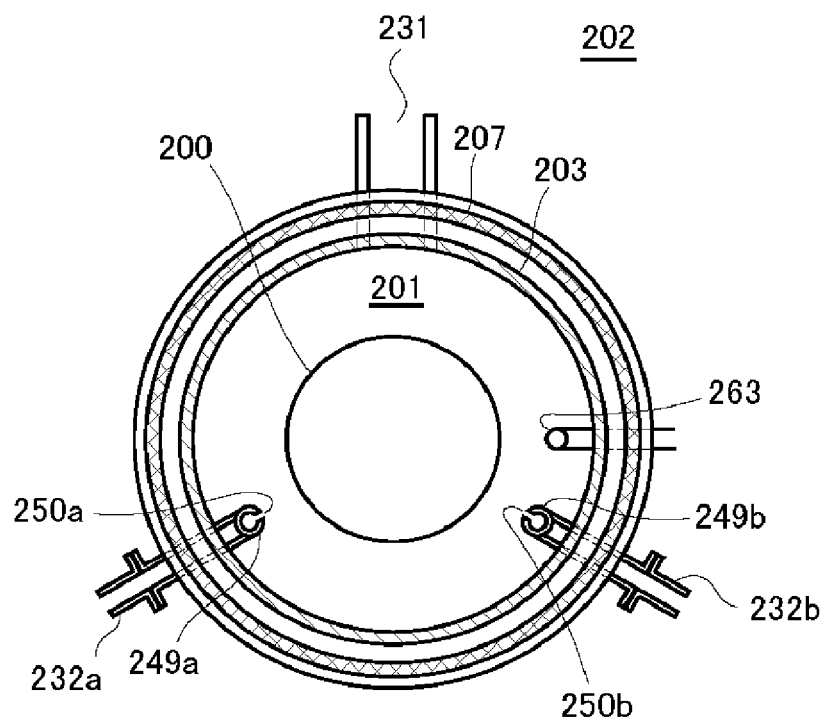
FIG. 2 is a schematic configuration view of the vertical process furnace of the substrate processing apparatus suitably used in an embodiment of the present disclosure, in which a portion of the process furnace is illustrated in a cross-sectional view taken along the line A-A in FIG. 1.

As illustrated in FIG. 2, each of the nozzles 249a and 249b is disposed in a space having an annular shape in a plane view between an inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. Specifically, each of the nozzles 249a and 249b is installed at a lateral side of a wafer arrangement region, in which the wafers 200 are arranged, namely in a region which horizontally surrounds the wafer arrangement region, to extend along the wafer arrangement region. Gas supply holes 250a and 250b for supplying a gas are installed on side surfaces of the nozzles 249a and 249b, respectively. Each of the gas supply holes 250a and 250b is opened to face a center of the reaction tube 203, so as to allow the gas to be supplied toward the wafers 200. The supply holes 250a and 250b are formed in a plural number between a lower portion of the reaction tube 203 and an upper portion of the reaction tube 203.

As a first precursor gas containing a first element, for example, a halosilane-based gas, which contains silicon (Si) as the first element and a halogen element, is supplied from the gas supply pipe 232a into the process chamber 201 via the MFC 241a, the valve 243a, and the nozzle 249a. A precursor gas refers to a gaseous precursor, for example, a precursor which remains in a gas state at room temperature and atmospheric pressure, or a gas obtained by vaporizing a precursor which remains in a liquid state at room temperature and atmospheric pressure. Halosilane is a silane having a halogen group. The halogen group includes a chloro group, a fluoro group, a bromo group, an iodo group, and the like. That is, the halogen group includes halogen elements such as chlorine (Cl), fluorine (F), bromine (Br), iodine (I), and the like. As the halosilane-based gas, for example, a precursor gas containing Si and Cl, that is, a chlorosilane-based gas can be used. As the first source gas, a chlorosilane-based gas in which the number of Si atoms contained in one molecule is one, for example, tetrachlorosilane ($SiCl_4$) gas can be used. The $SiCl_4$ gas acts as a Si source in a film-forming process to be described later. In the present disclosure, when the first source gas exists alone in the process chamber 201, a temperature at which the first precursor gas is pyrolyzed may be referred to as a first temperature. When the $SiCl_4$ gas is used as the first precursor gas, the first temperature is a predetermined temperature within a range of 800 degrees C. or higher.

As a second precursor gas containing the first element and having a pyrolysis temperature lower than a pyrolysis temperature of the first precursor gas, for example, a halosilane-based gas, which contains Si as the first element and a halogen element, is supplied from the gas supply pipe 232c into the process chamber 201 via the MFC 241c, the valve 243c, and the nozzle 249a. As the second precursor gas, a chlorosilane-based gas having two or more Si atoms contained in one molecule and having a Si—Si bond, for example, a hexachlorodisilane ($Si_2Cl_6$, abbreviation: HCDS) gas can be used. The $Si_2Cl_6$ gas acts as a Si source in the film-forming process to be described later. In the present disclosure, when the second precursor gas exists alone in the process chamber 201, a temperature at which the second precursor gas is pyrolyzed may be referred to as a second temperature. When the $Si_2Cl_6$ gas is used as the second precursor gas, the second temperature is a predetermined temperature within a range of 500 degree C. or higher.

A reaction gas containing a second element different from the first element, for example, a nitride gas containing nitrogen as the second element, is supplied from the gas supply pipe 232b into the process chamber 201 via the MFC 241b, the valve 243b, and the nozzle 249b. An example of the nitride gas may include an ammonia ($NH_3$) gas. The $NH_3$ gas acts as an N source in the film-forming process to be described.

As an inert gas, a nitrogen ($N_2$) gas is supplied from the gas supply pipes 232d and 232e into the process chamber 201 via the MFCs 241d and 241e, the valves 243d and 243e, the gas supply pipes 232a and 232b, and the nozzles 249a and 249b, respectively. The $N_2$ gas acts as a purge gas, a carrier gas, a dilution gas, or the like.

When the above gases flow from the corresponding gas supply pipes, respectively, a first precursor gas supply system mainly includes the gas supply pipe 232a, the MFC 241a, and the valve 243a. A second precursor gas supply system mainly includes the gas supply pipe 232c, the MFC 241c, and the valve 243c. A reaction gas supply system mainly includes the gas supply pipe 232b, the MFC 241b, and the valve 243b. An inert gas supply system mainly includes the gas supply pipes 232d and 232e, the MFCs 241d and 241e, and the valves 243d and 243e.

One or all of the above-described various supply systems may be configured as an integrated-type supply system 248 in which the valves 243a to 243e, the MFCs 241a to 241e, and so on are integrated. The integrated-type supply system 248 is connected to each of the gas supply pipes 232a to 232e. In addition, the integrated-type supply system 248 may be configured such that operations of supplying various gases into the gas supply pipes 232a to 232e, that is, opening/closing operation of the valves 243a to 243e, flow rate adjustment operation by the MFCs 241a to 241e, and the like are controlled by a controller 121 which will be described later. The integrated-type supply system 248 is configured as an integral type or a division type integrated unit, and is also configured so that it is detachable from the gas supply pipes 232a to 232e, and the like on an integrated unit basis, so that the maintenance, replacement, extension, etc. of the integrated-type supply system 248 can be performed on an integrated unit basis.

An exhaust pipe 231 configured to exhaust an internal atmosphere of the process chamber 201 is installed below a sidewall of the reaction tube 203. A vacuum pump 246, as a vacuum-exhausting device, is connected to the exhaust pipe 231 via a pressure sensor 245, which is a pressure detector (pressure detecting part) which detects an internal pressure of the process chamber 201, and an auto pressure controller (APC) valve 244, which is a pressure regulator (pressure adjustment part). The APC valve 244 is configured so that a vacuum exhaust and a vacuum exhaust stop of the interior of the process chamber 201 can be performed by opening or closing the valve while the vacuum pump 246 is actuated, and so that the internal pressure of the process chamber 201 can be adjusted by adjusting an opening degree of the valve based on pressure information detected by the pressure sensor 245 while the vacuum pump 246 is actuated. An exhausting system mainly includes the exhaust pipe 231, the pressure sensor 245, and the APC valve 244. The exhausting system may include the vacuum pump 246.

A seal cap 219, which serves as a furnace opening lid configured to hermetically seal a lower end opening of the reaction tube 203, is installed under the reaction tube 203. The seal cap 219 is made of, for example, a metal material such as stainless steel (SUS) or the like, and is formed in a disc shape. An O-ring 220, which is a seal member making contact with the lower end of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and out of the process chamber 201 by moving the seal cap 219 up and down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 in a spaced-apart relationship. The boat 217 is made of a heat resistant material such as quartz or SiC. Heat insulating plates 218 made of a heat resistant material such as, for example, quartz or SiC, are supported in a horizontal posture and in multiple stages at a lower portion of the boat 217.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
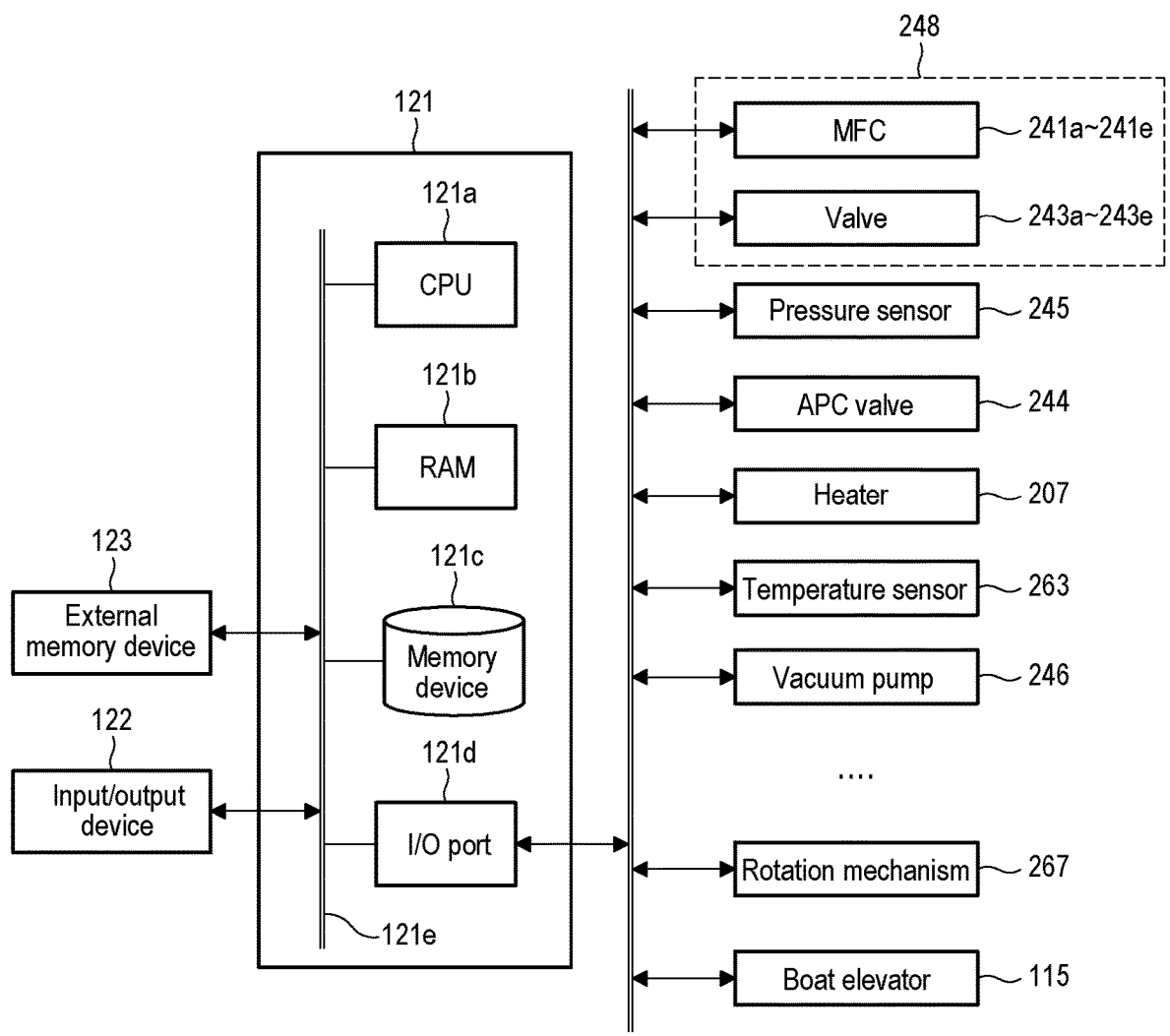
FIG. 3 is a schematic configuration diagram of a controller of the substrate processing apparatus suitably used in an embodiment of the present disclosure, in which a control system of the controller is illustrated in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is composed of, for example, a flash memory, a hard disk drive (HDD), or the like. A control program for controlling operations of a substrate processing apparatus, a process recipe, in which sequences and conditions of a film-forming process to be described later are written, or the like is readably stored in the memory device 121c. The process recipe functions as a program for causing the controller 121 to execute each sequence in the film-forming process, which will be described later, to obtain a predetermined result. Hereinafter, the process recipe and the control program may be collectively and simply referred to as a "program." Furthermore, the process recipe may be simply referred to as a "recipe." When the term "program" is used herein, it may indicate a case of including only the recipe, a case of including only the control program, or a case of including both the recipe and the control program. In addition, the RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, and the like.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to contents of the recipe thus read, the flow rate adjusting operation of various kinds of gases by the MFCs 241a to 241e, the opening/closing operation of the valves 243a to 243e, the opening/closing operation of the APC valve 244, the pressure adjusting operation by the APC valve 244 based on the pressure sensor 245, the driving and stopping of the vacuum pump 246, the temperature adjusting operation by the heater 207 based on the temperature sensor 263, the operation of rotating the boat 217 with the rotation mechanism 267 and adjusting the rotation speed of the boat 217, the operation of moving the boat 217 up and down by the boat elevator 115, and the like.

The controller 121 may be configured by installing, in the computer, the aforementioned program stored in an external memory device 123. The external memory device 123 includes, for example, a magnetic disk such as an HDD, an optical disc such as a CD, a magneto-optical disc such as an MO, a semiconductor memory such as a USB memory, and the like. The memory device 121c or the external memory device 123 is configured as a non-transitory computer-readable recording medium. Hereinafter, the memory device 121c and/or the external memory device 123 may be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be provided to the computer using communication means such as the Internet or a dedicated line, instead of using the external memory device 123.

(2) Substrate Processing Process

A substrate processing sequence example of forming a film on a wafer 200 as a substrate by using the aforementioned substrate processing apparatus, which is one of the processes for manufacturing a semiconductor device, that is, a film-forming sequence example, will be described with reference to FIGS. 4, 5 and 7A to 7C. In the following descriptions, the operations of the respective parts constituting the substrate processing apparatus are controlled by the controller 121.

Figure 4:
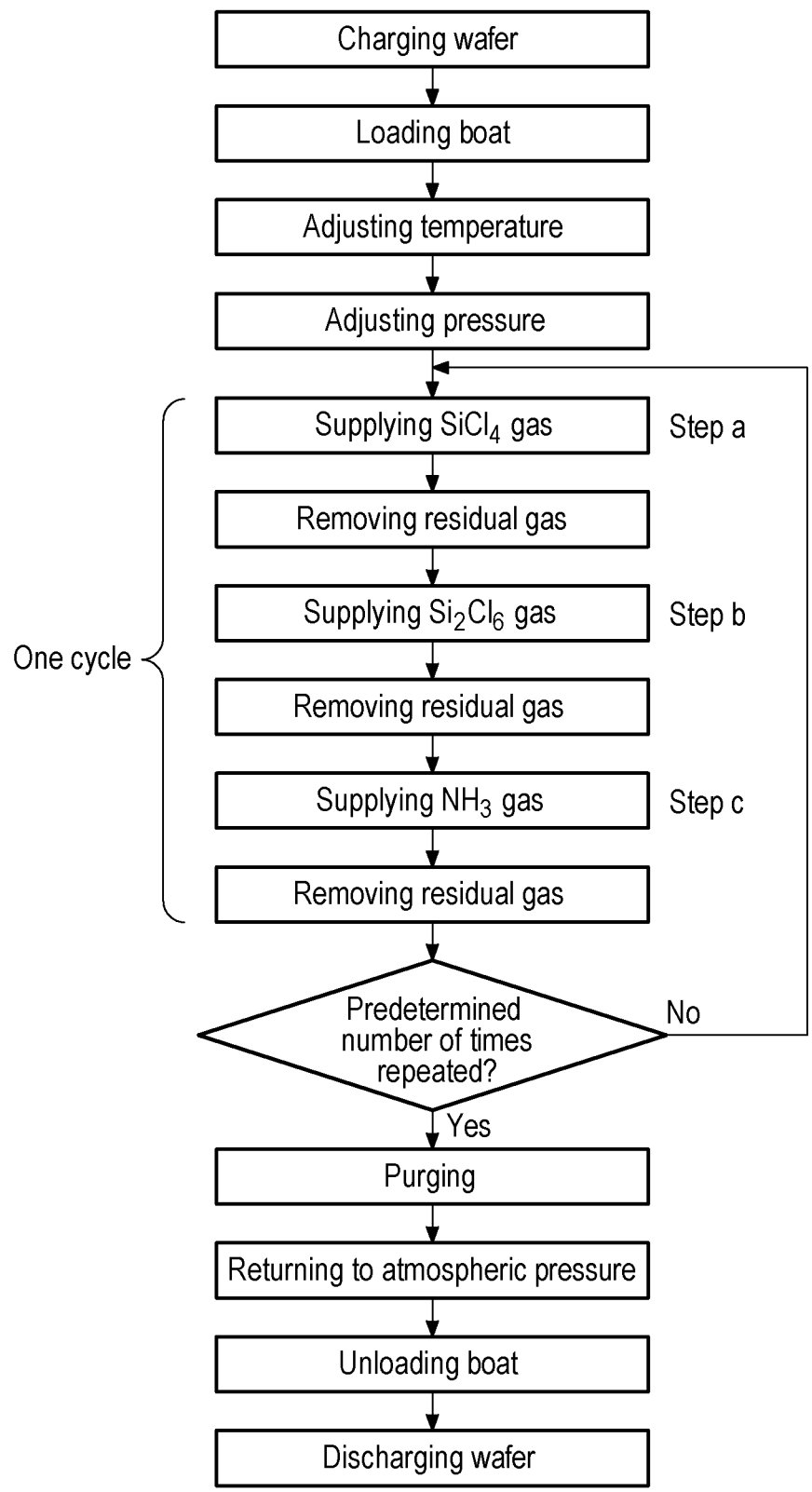
FIG. 4 is a diagram showing a flow of substrate processing process according to an embodiment of the present disclosure.
Figure 5:
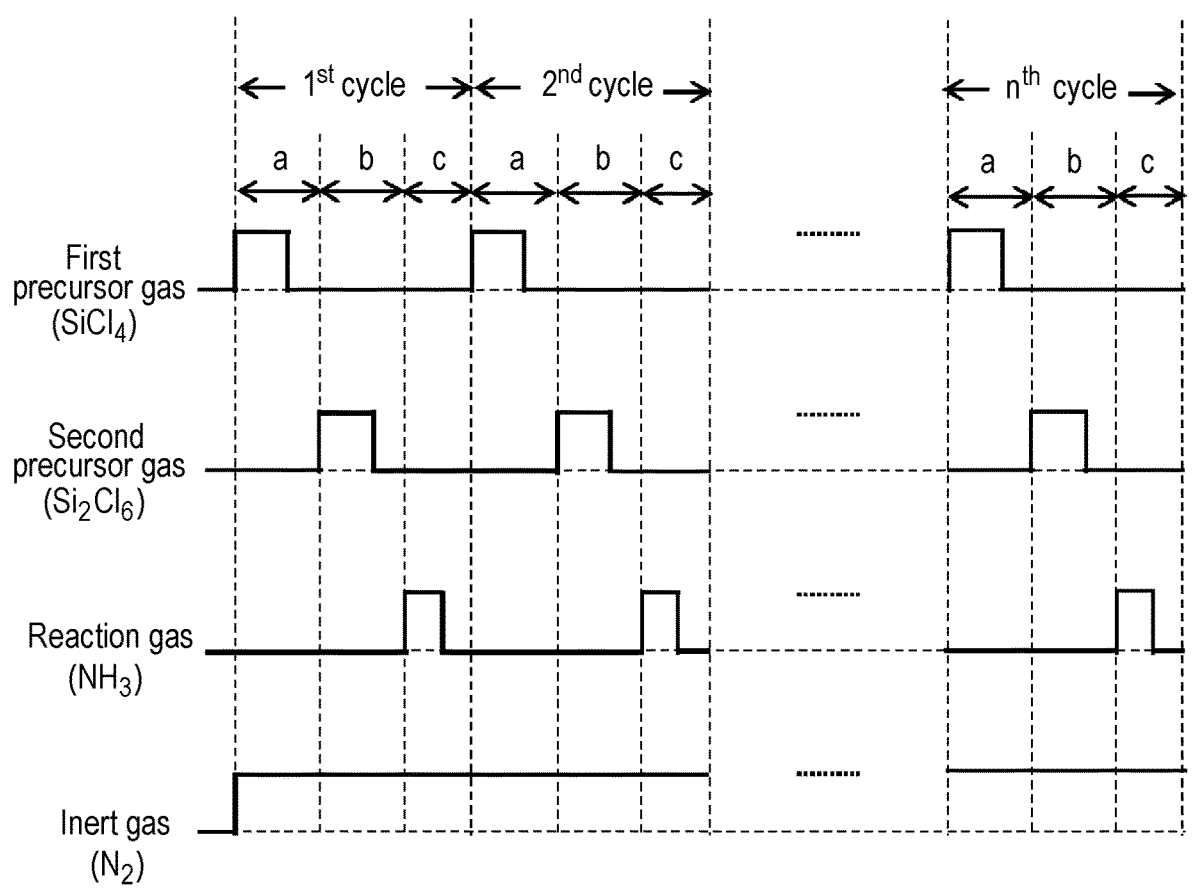
FIG. 5 is a diagram showing a gas supply timing in a film-forming process according to an embodiment of the present disclosure.

In the film-forming sequence illustrated in FIGS. 4 and 5, a silicon nitride film (SiN film) as a film containing Si and N is formed on a wafer 200 by performing a cycle a predetermined number of times (n times, n being an integer equal to or greater than 1), the cycle including sequentially performing:

a step a of supplying a $SiCl_4$ gas as a first precursor gas to the wafer 200 in a process chamber 201;

a step b of supplying a $Si_2Cl_6$ gas as a second precursor gas into the wafer 200; and a step c of supplying an $NH_3$ gas as a reaction gas to the wafer 200. In addition, in FIG. 5, periods of performing steps a, b, and c are represented as a, b, and c, respectively.

In the present disclosure, for the sake of convenience, the film-forming sequence illustrated in FIGS. 4 and 5 may be denoted as follows. The same denotation may be used in other embodiments to be described later.

$$(SiCl_4 \rightarrow Si_2Cl_6 \rightarrow NH_3) \times n \Rightarrow SiN$$

When the term "wafer" is used in the present disclosure, it may refer to "a wafer itself" or "a laminated body of a wafer and a predetermined layers or films formed on a surface of the wafer." When the phrase "a surface of a wafer" is used in the present disclosure, it may refer to "a surface of a wafer itself" or "a surface of a predetermined layer formed on a wafer". When the expression "a predetermined layer is formed on a wafer" is used in the present disclosure, it may mean that "a predetermined layer is formed directly on a surface of a wafer itself" or that "a predetermined layer is formed on a layer formed on a wafer." When the term "substrate" is used in the present disclosure, it may be synonymous with the term "wafer."

(Wafer Charging and Boat Loading)

A plurality of wafers 200 are charged on the boat 217 (wafer charging). Then, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Adjustment and Temperature Adjustment)

The interior of the process chamber 201, namely, a space in which the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired processing temperature (film-forming temperature). In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 is then initiated. The driving of the vacuum pump 246 and heating and rotating of the wafers 200 may be continuously performed at least until the processing of the wafers 200 is completed.

(Film-Forming Process)

Thereafter, the following steps a to c are sequentially performed.

[Step a]

In this step, a $SiCl_4$ gas is supplied to the wafers 200 in the process chamber 201. Specifically, the valve 243a is opened to allow the $SiCl_4$ gas to flow into the gas supply pipe 232a. The flow rate of the $SiCl_4$ gas is adjusted by the MFC 241a, and the $SiCl_4$ gas is supplied into the process chamber 201 via the nozzle 249a and is exhausted via the exhaust pipe 231. In this operation, the $SiCl_4$ gas is supplied to the wafers 200. At this time, the valves 243d and 243e are simultaneously opened to allow an $N_2$ gas to flow into the gas supply pipes 232d and 232e. The flow rate of the $N_2$ gas is adjusted by the MFCs 241d and 241e. The $N_2$ gas with its flow rate adjusted is supplied into the process chamber 201 together with the $SiCl_4$ gas and is exhausted via the exhaust pipe 231.

An example of the process conditions of this step may be described as follows.

$SiCl_4$ gas supply flow rate: 1 to 2,000 sccm, specifically 100 to 1,000 sccm $N_2$ gas supply flow rate (for each gas supply pipe): 1.00 to 20,000 sccm.

Gas supply time: 10 to 300 seconds, specifically 30 to 120 seconds

Processing temperature (temperature lower than the first temperature, specifically temperature lower than the first temperature and higher than the second temperature): 400 to 800 degrees C., specifically 500 to 800 degrees C., more specifically 600 to 750 degrees C.

Processing pressure: 1 to 2,666 Pa, specifically 10 to 1,333 Pa

In the present disclosure, the notation of a numerical range such as "400 to 800 degrees C." means that a lower limit value and an upper limit value are included in the range. Therefore, "400 to 800 degrees C." means "400 degrees C. or higher and 800 degrees C. or lower". The same applies to other numerical ranges.

In the present embodiment, as a pre-processing of this step, a pre-flow for supplying a reaction gas such as an $NH_3$ gas to the wafers 200 in advance is performed. By supplying the $NH_3$ gas to the wafers 200 in the pre-flow, an adsorption site by hydrogen (H) is formed on the surfaces of the wafers 200, which results in becoming a state in which Si atoms are easily adsorbed (i.e., a state having high reactivity with Si atoms) in this step or step b to be described later. The pre-flow procedure can be performed, for example, in the same manner as step c to be described later.

Under the aforementioned conditions, it is possible to cut a portion of the Si—Cl bond in $SiCl_4$ so that Si having a dangling bond is adsorbed on the adsorption site on the surfaces of the wafers 200. Further, under the aforementioned conditions, the uncut Si—Cl bond in $SiCl_4$ can be retained as it is. For example, in a state where Cl is bonded to each of three bonding hands among four bonding hands of Si constituting $SiCl_4$, Si having a dangling bond can be adsorbed on the adsorption site on the surfaces of the wafers 200. Further, since Cl retained without being cut from Si adsorbed on the surfaces of the wafers 200 inhibits Si from being bonded to other Si that has a dangling bond, it is possible to avoid multiple deposition of Si on the wafers 200. Cl separated from Si constitutes a gaseous substance such as HCl or $Cl_2$ and is exhausted via the exhaust pipe 231. When the Si adsorption reaction proceeds and there are no more adsorption sites remaining on the surfaces of the wafers 200, the adsorption reaction is saturated, but, it is desirable to finish this step with the adsorption sites remaining by stopping the supply of $SiCl_4$ gas before the adsorption reaction is saturated.

Figure 7A:
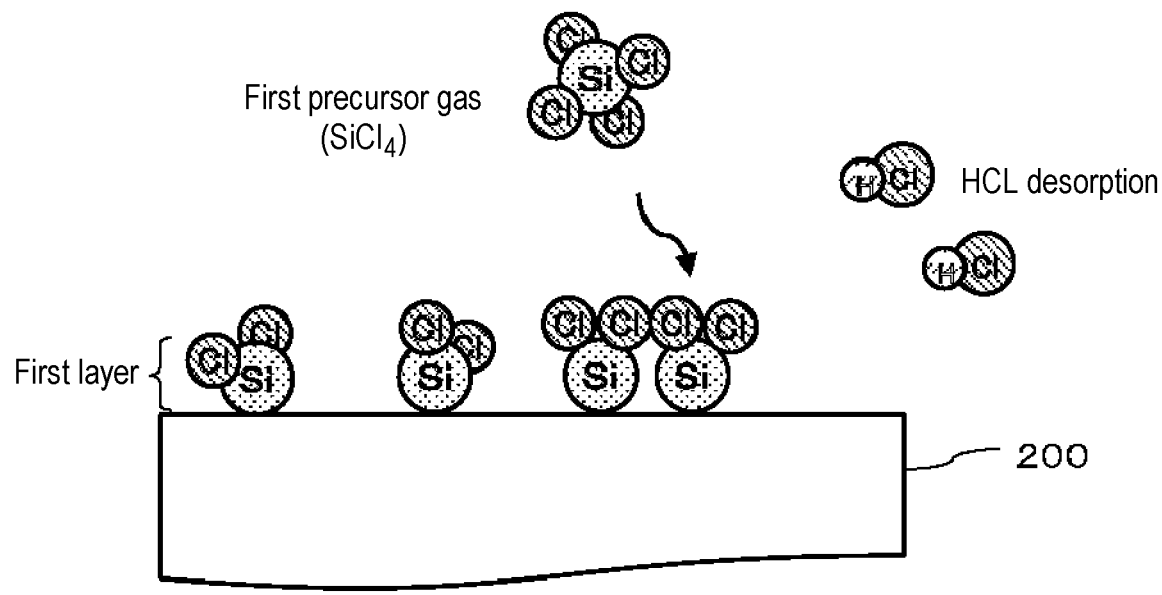
FIG. 7A is a partially enlarged view of the surface of a substrate after a first precursor gas is supplied by performing step a, FIG. 7B is a partially enlarged view of the surface of the substrate after a second precursor gas is supplied by performing step b.

As a result, a layer containing Si and Cl having substantially a uniform thickness of less than one atomic layer, that is, a Si-containing layer containing Cl is formed as a first layer on the wafers 200. FIG. 7A is a partially enlarged view of the surface of a wafer 200 on which the first layer is formed. Here, a layer having a thickness of less than one atomic layer means an atomic layer formed discontinuously, and a layer having a thickness of one atomic layer means an atomic layer formed continuously. The fact that the layer having a thickness of less than one atomic layer is substantially uniform means that atoms are adsorbed on the surface of the wafer 200 at substantially a uniform density. Since the first layer is formed on the wafer 200 to have substantially a uniform thickness, it is excellent in step coverage characteristics and wafer in-plane film thickness uniformity.

When the processing temperature is lower than 400 degrees C., it becomes difficult for Si to be adsorbed on the wafer 200, which may make it difficult to form the first layer. By setting the processing temperature to 400 degrees C. or higher, it is possible to form the first layer on the wafer 200. By setting the processing temperature to 500 degrees C. or higher, the above effect can be reliably obtained. By setting the processing temperature to 600 degrees C. or higher, the above effect can be more reliably obtained.

When the processing temperature exceeds 800 degrees, it becomes difficult to retain the uncut Si—Cl bond in $SiCl_4$ as it is, and a pyrolysis rate of $SiCl_4$ increases. As a result, Si is multiple-deposited on the wafer 200, which may make it difficult to form a Si-containing layer having substantially a uniform thickness of less than one atomic layer as the first layer. By setting the processing temperature to 800 degrees C. or lower, it becomes possible to form a Si-containing layer having substantially a uniform thickness of less than one atomic layer as the first layer. By setting the processing temperature to 750 degrees C. or lower, the above effect can be reliably obtained.

After forming the first layer on the wafer 200, the valve 243a is closed to stop the supply of $SiCl_4$ gas into the process chamber 201. Then, the interior of the process chamber 201 is vacuum-exhausted to remove a gas and the like remaining in the process chamber 201 from the interior of the process chamber 201. At this time, the valves 243d and 243e are kept open to maintain the supply of $N_2$ gas as the inert gas into the process chamber 201. The $N_2$ gas acts as a purge gas, which can enhance an effect of removing the gas or the like remaining in the process chamber 201 from the process chamber 201.

As the first precursor gas, in addition to the $SiCl_4$ gas, a halosilane precursor gas such as a dichlorosilane ($SiH_2Cl_2$, abbreviation: DCS) gas, a trichlorosilane ($SiHCl_3$, abbreviation: TCS) gas, or the like can be used.

As the inert gas, in addition to the $N_2$ gas, a rare gas such as an Ar gas, a He gas, a Ne gas, a Xe gas, or the like can be used. This also applies to steps b and c to be described below.

[Step b]

In this step, a $Si_2Cl_6$ gas is supplied to the wafer 200 in the process chamber 201, that is, the first layer formed on the wafer 200. Specifically, the valve 243c is opened to allow the $Si_2Cl_6$ gas to flow into the gas supply pipe 232a. The flow rate of the $Si_2Cl_6$ gas is controlled by the MFC 241c, and the $Si_2Cl_6$ gas is supplied into the process chamber 201 via the nozzle 249a and is exhausted via the exhaust pipe 231. In this operation, the $Si_2Cl_6$ gas is supplied to the wafer 200.

An example of the process conditions of this step may be described as follows.

$Si_2Cl_6$ gas supply flow rate: 1 to 2,000 sccm, specifically 100 to 1,000 sccm $Si_2Cl_6$ gas supply time: 0.5 to 60 seconds, specifically 1 to 30 seconds Processing temperature (temperature higher than the second temperature, specifically temperature higher than the second temperature and lower than the first temperature): 500 to 1,000 degrees C., specifically 600 to 800 degrees C., more specifically 650 to 750 degrees C.

The other process conditions are the same as the process conditions in step a.

Under the aforementioned conditions, most of the molecular structure of the $Si_2Cl_6$ gas is pyrolyzed, so that Si having a dangling bond by the pyrolysis can be adsorbed on the surface of the wafer 200 by reacting with an adsorption site on the surface of the wafer 200, which is left without the formation of the first layer in step a. On the other hand, since there is no adsorption site in the portion where the first layer is formed, the adsorption of Si on the first layer is suppressed. As a result, in this step, a Si-containing layer as a second layer is formed with substantially a uniform thickness on the basis of the first layer formed with substantially the uniform thickness. Further, Si atoms having dangling bonds due to the pyrolysis of the $Si_2Cl_6$ are bonded to each other to form a Si—Si bond. By reacting this Si—Si bond with the adsorption site and the like remaining on the surface of the wafer 200, it becomes possible to include the Si—Si bond in the second layer to form a layer in which Si is multiple-deposited. That is, in this step, an amount (content ratio) of Si—Si bonds contained in the second layer is made larger than an amount (content ratio) of Si—Si bonds contained in the first layer. Cl separated from Si constitutes a gaseous substance such as HCl or $Cl_2$ and is exhausted via the exhaust pipe 231.

In order to make the amount of Si—Si bonds contained in the second layer to be larger than the amount of Si—Si bonds contained in the first layer in this step, as described above, it is suitable that the pyrolysis temperature of the second precursor gas is lower than the pyrolysis temperature of the first precursor gas. In other words, as the second precursor gas, a gas which is more likely to form a Si—Si bond under the same conditions than the first precursor gas is desirable. For example, it is suitable that the Si—Si bond is contained in the molecule of the second precursor gas, or the composition ratio of Si to a halogen element such as Cl in the molecule of the second precursor gas is higher than that of the first precursor gas, etc. In this way, in this step, selection of the process conditions such as the processing temperature in each step or selection of the first precursor gas and the second precursor gas is performed so that it is more likely to form a Si—Si bond that react with an adsorption site and the like remaining on the wafer surface than in step a.

Figure 7B:
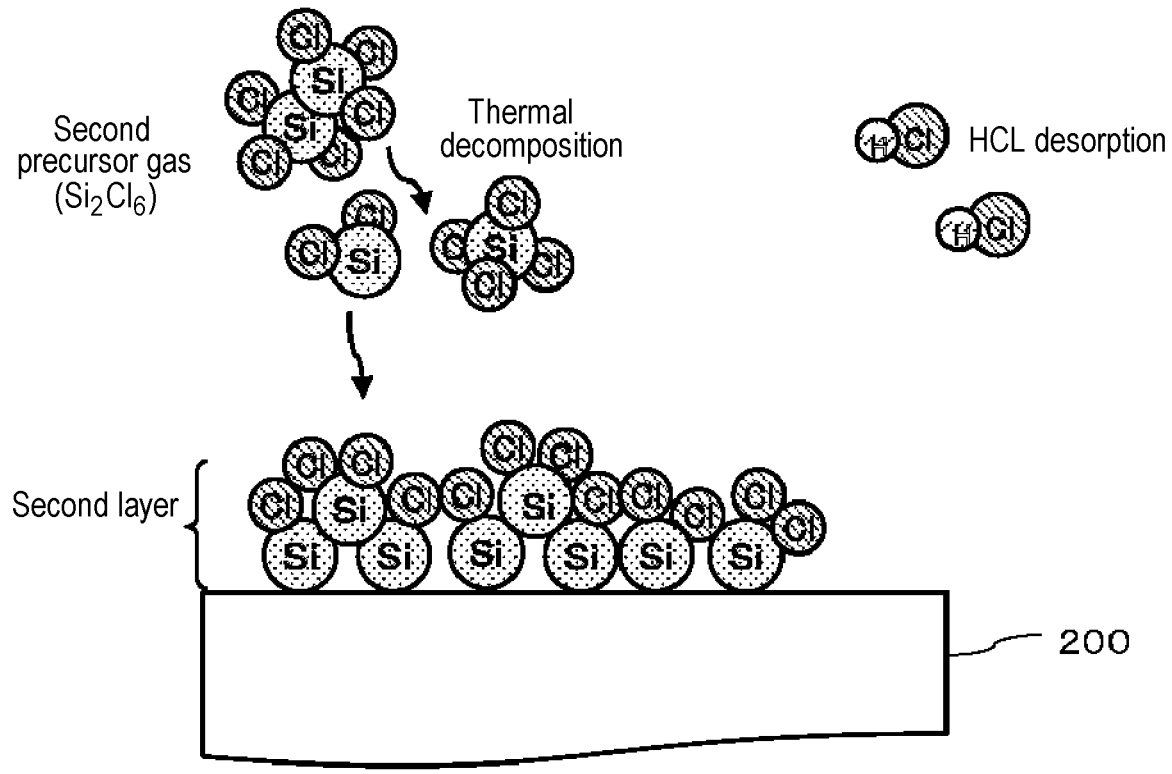
FIG. 7C is a partially enlarged view of the surface of the substrate after a reaction precursor gas is supplied by performing step c.

As a result, in this step, a Si-containing layer having a substantially uniform thickness exceeding the thickness of the first layer is formed as the second layer. From the viewpoint of improving the film-forming rate and the like, particularly in the present embodiment, a Si-containing layer having a substantially uniform thickness exceeding one atomic layer is formed as the second layer. FIG. 7B is a partially enlarged view of the surface of the wafer 200 on which the second layer is formed. In the present disclosure, the second layer means a Si-containing layer on the wafer 200 formed by performing steps a and b once.

When the processing temperature is lower than 500 degrees C., the $Si_2Cl_6$ gas is less likely to be pyrolyzed, which may make it difficult to form the second layer. By setting the processing temperature to 500 degrees C. or higher, the second layer can be formed on the first layer. By setting the processing temperature to 600 degrees C. or higher, the above effect can be reliably obtained. By setting the processing temperature to 650 degrees C. or higher, the above effect can be more reliably obtained.

When the processing temperature exceeds 1,000 degrees C., the pyrolysis of the $Si_2Cl_6$ gas becomes excessive and the deposition of Si that is not easily self-saturated progresses rapidly, which may make it difficult to form the second layer substantially uniformly. By setting the processing temperature to 1,000 degrees C. or lower, the $Si_2Cl_6$ gas is prevented from being excessively thermally decomposed, and the deposition of Si that does not self-saturate is controlled, whereby the second layer can be formed substantially uniformly. By setting the processing temperature to 800 degrees C. or lower, the above effect can be reliably obtained. By setting the processing temperature to 750 degrees C. or lower, the above effect can be more reliably obtained.

It is desirable that the temperature conditions in steps a and b are substantially the same. This makes it unnecessary to perform a change of the temperature of the wafer 200, that is, a change of the internal temperature of the process chamber 201 (change of the set temperature of the heater 207) between steps a and b. As a result, it is not needed to stand by until the temperature of the wafer 200 becomes stabilized between steps, thereby improving the throughput of substrate processing. Therefore, in both steps a and b, temperature of the wafer 200 may be set to a predetermined temperature within the range of, for example, 500 to 800 degrees C., specifically 600 to 800 degrees C., more specifically 650 to 750 degrees C. In the present embodiment, when the temperature conditions in steps a and b are substantially the same, the temperature conditions, the first precursor gas, and the second precursor gas are selected such that the pyrolysis of the first precursor gas does is not substantially caused (that is, suppressed) in step a and the pyrolysis of the second precursor gas is caused (that is, promoted) in step b.

After forming the second layer on the wafer 200, the valve 243c is closed to stop the supply of $Si_2Cl_6$ gas into the process chamber 201. Then, the gas and the like remaining in the process chamber 201 are removed from the process chamber 201 by the same processing procedure and process conditions as those in the step of removing the residual gas in the above step a.

As the second precursor gas, in addition to the $Si_2Cl_6$ gas, a silicon hydride-based precursor gas such as a monosilane ($SiH_4$, abbreviation: MS) gas, an aminosilane-based precursor gases such as a trisdimethylaminosilane ($Si[N(CH_3)_2]_3H$, abbreviation: 3DMAS) gas or a bisdiethylaminosilane ($SiH_2[N(C_2H_5)_2]_2$, abbreviated as BDEAS) gas, or the like can be used. By using a non-halogen gas as the second precursor gas, it becomes possible to avoid mixing of halogen into a SiN film finally formed on the wafer 200.

[Step c]

In this step, an $NH_3$ gas is supplied to the wafer 200 in the process chamber 201, that is, a layer formed by stacking the first layer and the second layer on the wafer 200. Specifically, the valve 243b is opened to allow the $NH_3$ gas to flow into the gas supply pipe 232b. The flow rate of the $NH_3$ gas is controlled by the MFC 241b, and the $NH_3$ gas is supplied into the process chamber 201 via the nozzle 249b and is exhausted via the exhaust pipe 231. In this operation, the $NH_3$ gas is supplied to the wafer 200.

An example of the process conditions in this step may be described as follows:

$NH_3$ gas supply flow rate: 100 to 10,000 sccm, specifically 1,000 to 5,000 sccm $NH_3$ gas supply time: 1 to 120 seconds, specifically 10 to 60 seconds Processing pressure: 1 to 4,000 Pa, specifically 10 to 1,000 Pa.

The other process conditions are the same as the process conditions in step a. However, the temperature conditions in step c are desirably the same as those in steps a and b from the viewpoint of improving the productivity of the film-forming process, but may be different from these conditions.

Under the aforementioned conditions, at least a portion of the second layer can be nitrided. Cl contained in the second layer constitutes a gaseous substance such as HCl and $Cl_2$ and is exhausted via the exhaust pipe 231.

Figures 7C, 8:
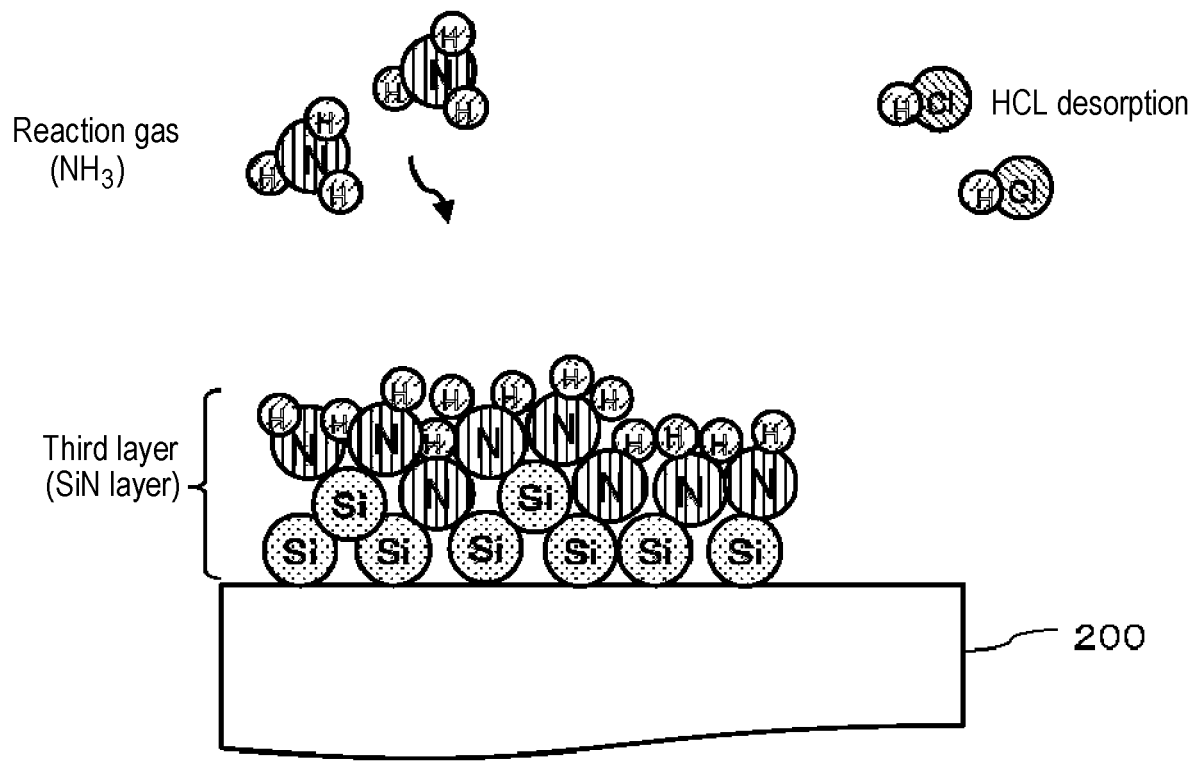
FIG. 8 is a table showing evaluation results of a film formed on the substrate.

As a result, a SiN layer containing Si and N is formed as a third layer on the wafer 200. FIG. 7C is a partially enlarged view of the surface of the wafer 200 on which the third layer is formed.

After forming the third layer on the wafer 200, the valve 243b is closed to stop the supply of $NH_3$ gas into the process chamber 201. Then, the gas and the like remaining in the process chamber 201 are removed from the process chamber 201 by the same processing procedure and process conditions as those in the step of removing the residual gas in the above step a.

As the reaction gas, in addition to the $NH_3$ gas, a hydrogen nitride-based gas such as a diazene ($N_2H_2$) gas, a hydrazine ($N_2H_4$) gas, an $N_3H_8$ gas, or the like can be used.

(Performing Predetermined Number of Times)

A cycle including the above steps a to c is performed a predetermined number of times (n times, n being an integer equal to or greater than 1) to form a SiN film having a predetermined composition and a predetermined film thickness on the wafer 200. This cycle may be repeated multiple times. That is, a thickness of the SiN layer formed per cycle may be set to be smaller than a desired film thickness, and the above cycle may be repeated multiple times to reach the desired film thickness.

(After-Purging and Returning to Atmospheric Pressure)

After the above-described film-forming process is completed, an $N_2$ gas as an inert gas is supplied into the process chamber 201 from each of the gas supply pipes 232d and 232e and is exhausted via the exhaust pipe 231. Thus, the interior of the process chamber 201 is purged and the residual gas and the reaction byproducts remaining in the process chamber 201 are removed from the interior of the process chamber 201 (after-purge). The internal atmosphere of the process chamber 201 is then substituted with an inert gas (inert gas substitution) and the internal pressure of the process chamber 201 is returned to an atmospheric pressure (returning to atmospheric pressure).

(Boat Unloading and Wafer Discharging)

The seal cap 219 is then moved down by the boat elevator 115 to open the lower end of the reaction tube 203. In addition, the processed wafers 200 supported by the boat 217 are unloaded from the lower end of the reaction tube 203 to the outside of the reaction tube 203 (boat unloading). After the boat unloading, the processed wafers 200 are discharged from the boat 217 (wafer discharging).

(3) Effects According to the Present Embodiment

According to the present embodiment, one or more effects set forth below may be achieved.

(a) In this embodiment, since both step a of supplying the $SiCl_4$ gas and step b of supplying the $Si_2Cl_6$ gas are performed in one cycle, it is possible to achieve both the effect of improving the step coverage characteristics and the wafer in-plane film thickness uniformity of the SiN film formed on the wafer 200 and the effect of increasing the film formation rate of this film.

This is because when the $SiCl_4$ gas, which has a higher pyrolysis temperature than that of the $Si_2Cl_6$ gas and is less likely to be pyrolyzed, is supplied to the wafer 200 under the aforementioned process conditions, the Si-containing layer (the first layer) having a substantially uniform thickness of less than one atomic layer is formed on the wafer 200. If a cycle, which sequentially performs step a of supplying the $SiCl_4$ gas and step c of supplying the $NH_3$ gas without performing step b, is performed a predetermined number of times, since the thickness of the Si-containing layer formed per cycle is uniform over the wafer in-plane, it is possible to improve the step coverage characteristics and the wafer in-plane film thickness uniformity of the SiN film finally formed on the wafer 200. On the other hand, since the thickness of the Si-containing layer formed per cycle is thin, it may be difficult to increase the deposition rate of the SiN film formed on the wafer 200.

On the other hand, when the $Si_2Cl_6$ gas, which has a lower pyrolysis temperature than that of the $SiCl_4$ gas and is more likely to be pyrolyzed, is supplied to the wafer 200 under the aforementioned process conditions, the Si-containing layer (the second layer) having a Si—Si bond and having a thickness of more than one atomic layer is formed on the wafer 200. If a cycle, which sequentially performs step b of supplying the $Si_2Cl_6$ gas and step c of supplying the $NH_3$ gas without performing step a, is performed a predetermined number of times, since the thickness of the Si-containing layer formed per cycle is thick, it is possible to improve the deposition rate of the SiN film finally formed on the wafer 200. On the other hand, since the thickness of the Si-containing layer formed per cycle tends to be non-uniform in the wafer plane, it may be difficult to improve the step coverage characteristics and the wafer in-plane film thickness uniformity of the SiN film formed on the wafer 200.

In the present embodiment, since both steps a and b are performed, it is possible to achieve both the effects obtained from each step. For example, by completing step a before the adsorption reaction of Si is saturated and proceeding to step b having a relatively large deposition rate, it is possible to improve the deposition rate as compared with a case where only step a is performed for the same time. Further, after forming the first layer having a relatively excellent thickness uniformity in step a, by forming the second layer based on the first layer in step b, it is possible to improve the step coverage characteristics and the wafer in-plane film thickness uniformity of the SiN film formed on the wafer 200, as compared to a case where only step b is performed.

(b) In the present embodiment, in each cycle, by performing step a before step b and then performing step b, it is possible to increase the deposition rate of the SiN film finally formed on the wafer 200 while sufficiently exhibiting the step coverage characteristics and the wafer in-plane film thickness uniformity thereof.

For example, in each cycle, when step b is performed before step a and then step a is performed, since Si containing a Si—Si bond generated by pyrolysis is likely to be irregularly adsorbed on the surface of the wafer 200 in step b, a layer that tends to have a non-uniform thickness in the wafer plane may be formed as a base of the Si-containing film to be formed in step a. Therefore, the technical significance of step a of forming a Si-containing layer having a substantially uniform thickness during the film-forming process is likely to be lost.

On the other hand, in this embodiment, in each cycle, since step a is performed before step b, and step b is then performed, it is possible to form a Si-containing layer having a substantially uniform thickness as a base of the Si-containing film to be formed in step b. Therefore, it is possible to fully exert the technical significance of step a of forming a Si-containing layer having a substantially uniform thickness during the film-forming process.

(c) In this embodiment, it is possible to widely control the composition ratio of Si and N in the SiN film finally formed on the wafer 200.

This is because by reducing the ratio (B/A) of a supply amount (B) of the $Si_2Cl_6$ gas per cycle to the substrate to a supply amount (A) of the $SiCl_4$ gas per cycle to the substrate, a ratio of Si—Si bond contained in the second layer is reduced so that the thickness of the second layer can be controlled so as to be thin. By thinning the second layer, that is, a layer to be nitrided in step c, the composition ratio of the SiN film finally formed on the wafer 200 can be controlled so as to reduce the Si composition ratio. For example, by reducing the ratio (B/A), the thickness of the second layer becomes thin, e.g., within the range of thickness exceeding one atomic layer. Thus, it can be controlled so as to reduce the composition ratio of Si with respect to the composition ratio in the stoichiometric composition of the SiN film (that is, Si:N=3:4).

Further, by increasing B/A, the ratio of Si—Si bonds contained in the second layer can be increased so that the thickness of the second layer can be controlled so as to be thick. By increasing the thickness of the second layer, that is, a layer to be nitrided in step c, the composition ratio of the SiN film finally formed on the wafer 200 can be controlled so as to increase the Si composition ratio. For example, by increasing the ratio B/A, the thickness of the second layer becomes thick within the range of thickness exceeding one atomic layer. Thus, it can be controlled so as to increase the composition ratio of Si (that is, to be Si-rich) with respect to the composition ratio in the stoichiometric composition of the SiN film.

In addition, the above-mentioned B/A can be controlled, for example, by adjusting the magnitude of the ratio ($T_B/T_A$) of the supply time ($T_B$) of the $Si_2Cl_6$ gas per cycle to the supply time ($T_A$) of the $SiCl_4$ gas per cycle, that is, by adjusting the supply time of the $SiCl_4$ gas and the $Si_2Cl_6$ gas per cycle. Further, the above-mentioned B/A can be controlled by adjusting the magnitude of the ratio ($F_B/F_A$) of the supply flow rate ($F_B$) of the $Si_2Cl_6$ gas to the supply flow rate ($F_A$) of the $SiCl_4$ gas.

Further, by adjusting the magnitude of the internal pressure ($P_B$) of the process chamber 201 in step b to control the pyrolysis rate of the $Si_2Cl_6$ gas, the composition ratio, which is the ratio between the content of Si and the content of N, in the SiN film finally formed on the wafer 200 can be controlled.

For example, by reducing the pressure ($P_B$), the thickness of the second layer can be controlled so as to be thin. By thinning the second layer, that is, the layer to be nitrided in step c, the composition ratio in the SiN film finally formed on the wafer 200 can be controlled so that the Si composition ratio becomes smaller.

Further, by increasing the pressure ($P_B$) over the internal pressure (PA) of the process chamber 201 in step a, the thickness of the second layer can be controlled so as to be thick. By thickening the second layer, that is, the layer to be nitrided in step c, the composition ratio in the SiN film finally formed on the wafer 200 can be controlled so that the Si composition ratio becomes larger.

(d) In this embodiment, since the processing temperature in step a is made lower than the pyrolysis temperature (the first temperature) of the $SiCl_4$ gas and the processing temperature in step b is made higher than the pyrolysis temperature (the second temperature) of the $Si_2Cl_6$ gas, the above-mentioned effect can be reliably obtained.

This is because in step a, since the processing temperature is set to be lower than the first temperature, the pyrolysis of the $SiCl_4$ gas can be suppressed, which makes it possible to improve the step coverage characteristics and the wafer in-plane film thickness uniformity of the SiN film finally formed on the wafer 200. Further, it is possible to control the composition ratio of the SiN film so as to approach $Si_3N_4$.

Further, in step b, since the processing temperature is made higher than the second temperature, the pyrolysis of the $Si_2Cl_6$ gas can be appropriately maintained, which makes it possible to improve the deposition rate of the SiN film finally formed on the wafer 200. Further, it is possible to control the composition ratio of the SiN film so as to be Si-rich.

(e) The above-mentioned effects can be similarly obtained even when the first precursor gas other than the $SiCl_4$ gas is used, when the second precursor gas other than the $Si_2Cl_6$ gas is used, when the reaction gas other than the $NH_3$ gas is used, The same can be obtained when an inert gas other than $N_2$ gas is used.

Other Embodiments

Some embodiments of the present disclosure have been specifically described above. However, the present disclosure is not limited to the above-described embodiments, and various changes can be made without departing from the gist of the present disclosure.

In the above-described embodiments, N is taken as an example of the second element, and the $NH_3$ gas is taken as an example of the reaction gas containing the second element. However, the present disclosure may not be limited thereto. For example, oxygen (O) may be used as the second element, and as the reaction gas containing the second element, an $O_2$ gas, an ozone ($O_3$) gas, water vapor ($H_2O$ gas), an $O_2+H_2$ gas, a nitric oxide (NO) gas, a nitrous oxide ($N_2O$) gas, a nitrogen dioxide ($NO_2$) gas, etc. may be used. Further, as the reaction gas, both of these O-containing gases and the above-mentioned $NH_3$ gas may be used.

For example, a silicon oxide film (SiO film) may be formed on the wafer 200 by the following film-forming sequences.

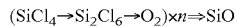

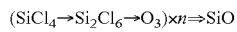

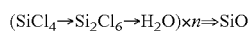

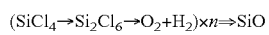

Further, for example, a silicon oxynitride film (SiON film) may be formed on the wafer 200 by the following film-forming sequences.

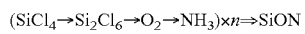

The processing procedure and process conditions in each step of these film-forming sequences can be the same processing procedure and process conditions as those in the above-described embodiment, for example. These cases can also achieve the same effects as the above-described embodiment.

Figure 6:
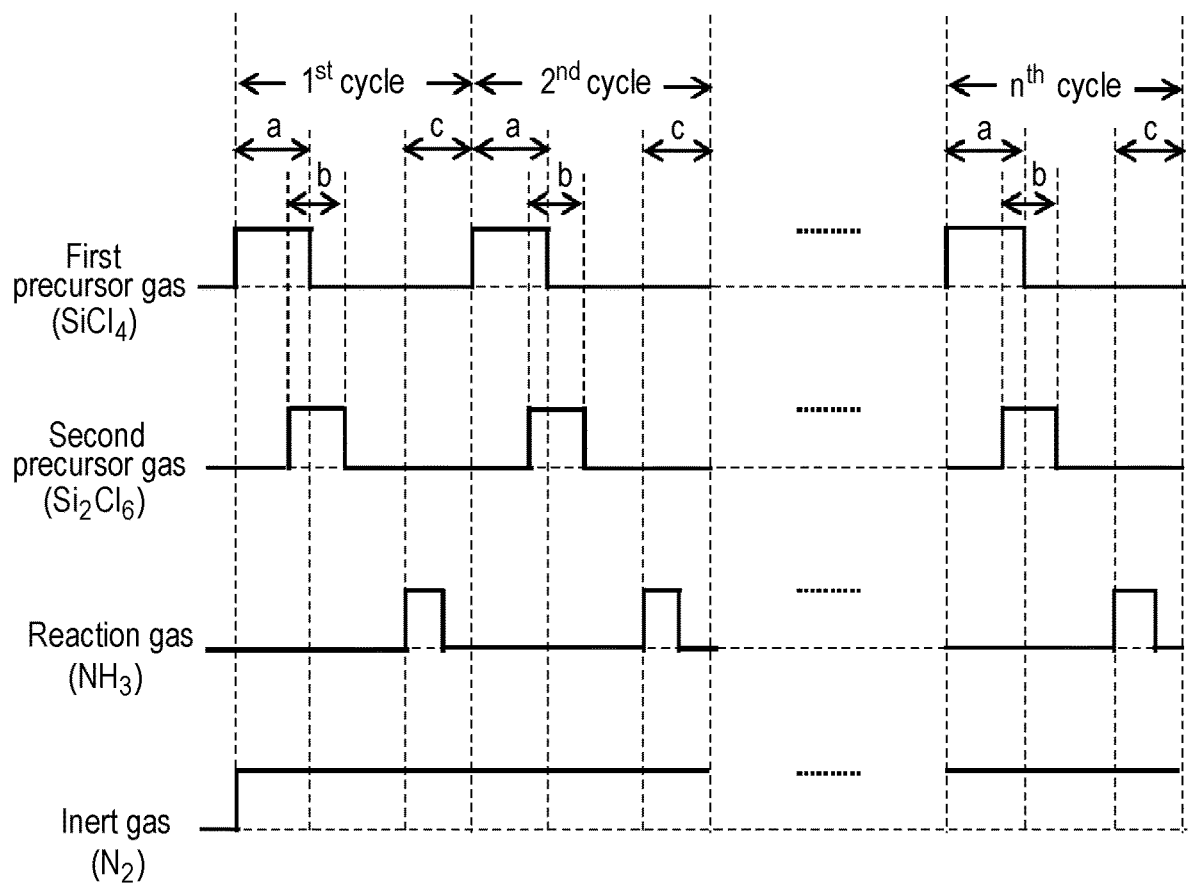
FIG. 6 is a diagram showing a modified example of the gas supply timing in the film-forming process according to an embodiment of the present disclosure.

An example in which a period (a) of performing step a and a period (b) of performing step b do not overlap with each other, for example, an example in which the supply of $SiCl_4$ gas is stopped in step a, and step b is then started after the performance period (a) is finished, has been described in the above-described embodiment (see FIG. 5). The present disclosure may not be limited thereto. For example, the period (a) of performing the step a overlaps with at least a portion of the period (b) of performing the step b such as starting step b to supply the $Si_2Cl_6$ gas while the supply of $SiCl_4$ gas is continued in step a (see FIG. 6). By doing so, in addition to the above-mentioned effects, the cycle time can be shortened to improve the throughput of substrate processing.

Further, the above-described embodiments and the like can be used in proper combination. The processing procedure and processing condition at this time can be the same as the processing procedure and processing condition of the above-described embodiments, for example.

Example

As Samples 1 to 5, the substrate processing apparatus illustrated in FIG. 1 was used to form a SiN film on a wafer.

Sample 1 was prepared by performing a cycle n times, the cycle of performing step a and step c in this order without performing step b. Samples 2 to 5 were prepared by performing a cycle n times, the cycle of performing steps a to c in this order.

In Samples 1 to 5, a supply time of the $SiCl_4$ gas in step a was set to 60 seconds. Further, in Samples 2 to 5, a supply time of the $Si_2Cl_6$ gas in step b was set to 1.5 seconds, 4.5 seconds, 9 seconds, and 18 seconds, respectively. The other process conditions, including the number of times of cycles and the gas supply amount, were common conditions within the process conditions range in the above-described embodiments.

Then, in Samples 1 to 5, the wafer in-plane average film thickness (A) of the SiN film and the refractive index (RI) with respect to light having a wavelength of 633 nm were measured. The results are shown in FIG. 8.

According to FIG. 8, it can be seen that the wafer in-plane average film thickness of the SiN films in Samples 2 to 5 is larger than the wafer in-plane average film thickness of the SiN film in Sample 1. That is, it can be seen that a deposition amount of the SiN film per cycle increases (that is, the deposition rate improves) in a case where both the $SiCl_4$ gas and the $Si_2Cl_6$ gas are supplied as the precursor gas more than in a case where only the $SiCl_4$ gas is supplied as the precursor gas without supplying the $Si_2Cl_6$ gas.

In addition, according to FIG. 8, it can be seen that the wafer in-plane average film thickness of the SiN films in Samples 2 to 5 becomes thicker as the supply time of the $Si_2Cl_6$ gas becomes longer. It is understood from this that the longer the supply time of the $Si_2Cl_6$ gas is, the more the deposition amount of the SiN film per cycle is increased, that is, the deposition rate of the SiN film formed on the wafer 200 is improved.

Further, according to FIG. 8, it can be seen that the refractive index of the SiN film in Samples 2 to 5 is larger than the refractive index of the SiN film in Sample 1. That is, it can be seen that the refractive index of the SiN film becomes larger in a case where both the $SiCl_4$ gas and the $Si_2Cl_6$ gas are supplied as the precursor gas than in a case where only the $SiCl_4$ gas is supplied as the precursor gas without supplying the $Si_2Cl_6$ gas. Considering that Si has the refractive index of 3.882 with respect to light having a wavelength of 633 nm, it can be seen that the Si composition ratio of the SiN film formed on the wafer 200 is higher in a case where both the $SiCl_4$ gas and the $Si_2Cl_6$ gas are supplied as the precursor gas than in a case where only the $SiCl_4$ gas is supplied as the precursor gas without supplying the $Si_2Cl_6$ gas.

Further, it can be seen that the refractive index of the SiN film in Samples 2 to 5 increases as the $Si_2Cl_6$ gas supply time increases. That is, it can be seen that the Si composition ratio of the SiN film formed on the wafer 200 increases as the $Si_2Cl_6$ gas supply time increases.

As Samples 6 and 7, the substrate processing apparatus illustrated in FIG. 1 was used to form a SiN film on the wafer.

Samples 6 and 7 were prepared by performing the following process on a wafer having a trench structure with a groove width of about 50 nm, a groove depth of about 10 μm, and an aspect ratio of about 200 in a surface of the wafer.

Sample 6 was prepared by performing a cycle n times, the cycle of performing step b and step c in this order without performing step a. Sample 7 was prepared by performing a cycle n times, the cycle of performing steps a to c in this order.

Specifically, in Sample 7, the $SiCl_4$ gas supply time in step a was set to 60 seconds. In Samples 6 and 7, the $Si_2Cl_6$ gas supply time in step b was set to 9 seconds. The other process conditions, including the number of times of cycles and the gas supply amount, were common conditions within the process conditions range in the above-described embodiment.

Then, a Top/Bottom ratio (%) and a Range (%) of the SiN films of Samples 6 and 7 were measured. The results are shown in FIG. 9. The "Top/Bottom ratio (%)" represents, by percentage, a ratio of a thickness of a film formed on an upper portion of the groove of the trench structure to a thickness of a film formed on a lower portion of the groove of the trench structure. The Top/Bottom ratio (%) is calculated by a formula C/D×100, where C and D are thicknesses of the films formed on the upper and lower portions of the groove of the trench structure, respectively. The "Range (%)" represents, by percentage, a difference between a value of a thickness of a film formed on the upper portion of the groove and a value of a thickness of a film formed on the lower portion of the groove with respect to an average value of a thickness values of films formed on the upper portion and the lower portion of the groove of the trench structure. The Range (%) is calculated by a formula |C−D|/{(C+D)/2}×100, where C and D are thicknesses of films formed on the upper and lower portions of the groove of the trench structure, respectively.

According to FIG. 9, it can be seen that the Top/Bottom ratio in Sample 7 is larger than the Top/Bottom ratio in Sample 6. Further, it can be seen that the Range in Sample 7 is smaller than the Range in Sample 6. That is, it can be understood that the step coverage characteristics and the wafer in-plane film thickness uniformity are better in a case where both the $SiCl_4$ gas and the $Si_2Cl_6$ gas are supplied than in a case where only the $Si_2Cl_6$ gas is supplied without supplying the $SiCl_4$ gas.

According to the present disclosure, it is possible to provide a technique capable of improving the properties of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film, which contains a first element and a second element, on a substrate by performing a cycle a predetermined number of times, the cycle sequentially performing:
        (a) supplying a first precursor gas containing the first element to the substrate in a process chamber;
        (b) supplying a second precursor gas, which contains the first element and has a pyrolysis temperature lower than a pyrolysis temperature of the first precursor gas, to the substrate; and
        (c) supplying a reaction gas, which contains the second element that is different from the first element, to the substrate,
    wherein a temperature of the substrate in (a) is set to a temperature lower than a temperature at which the first precursor gas is pyrolyzed when the first precursor gas exists alone in the process chamber, and
    wherein a temperature of the substrate in (b) is set to a temperature higher than a temperature at which the second precursor gas is pyrolyzed when the second precursor gas exists alone in the process chamber.

2. The method of claim 1, wherein in (a), a first layer containing the first element is formed with a thickness of less than one atomic layer, and
    wherein in (b), a second layer containing the first element is formed with a thickness of more than one atomic layer.

3. The method of claim 2, wherein an amount of bonds between the first element and the first element, which are contained in the second layer, is made to be larger than an amount of bonds between the first element and the first element, which are contained in the first layer.

4. The method of claim 1, wherein a temperature of the substrate in (a) is substantially equal to a temperature of the substrate in (b).

5. The method of claim 1, wherein a composition ratio, which is a ratio between a content of the first element and a content of the second element in the film, is controlled by adjusting a ratio (B/A) of a supply amount (B) of the second precursor gas per cycle to a supply amount (A) of the first precursor gas per cycle.

6. The method of claim 5, wherein the composition ratio of the film is controlled to approach a stoichiometric composition of a compound composed of the first element and the second element by reducing the B/A ratio, and
    wherein the composition ratio of the film is controlled to increase a content ratio of the first element to be more than a content ratio of the first element in the stoichiometric composition by increasing the B/A ratio.

7. The method of claim 5, wherein the composition ratio of the film is controlled by adjusting a ratio ($T_B/T_A$) of a supply time ($T_B$) of the second precursor gas per cycle to a supply time ($T_A$) of the first precursor gas per cycle.

8. The method of claim 5, wherein the composition ratio of the film is controlled by adjusting a ratio ($F_B/F_A$) of a supply flow rate ($F_B$) of the second precursor gas to a supply flow rate ($F_A$) of the first precursor gas.

9. The method of claim 1, wherein a composition ratio, which is a ratio between a content of the first element and a content of the second element in the film, is controlled by adjusting an internal pressure ($P_B$) of the process chamber in (b).

10. The method of claim 1, wherein halosilane-based gases different from each other are used as the first precursor gas and the second precursor gas, respectively.

11. The method of claim 1, wherein a gas, which contains at least any one selected from the group of a silicon hydride-based gas and an aminosilane-based gas, is used as the second precursor gas.

12. The method of claim 1, wherein a gas, which contains at least any one selected from the group of a nitriding gas and an oxidizing gas, is used as the reaction gas.

13. The method of claim 1, wherein when performing the cycle, a period of performing (a) and a period of performing (b) do not overlap with each other.

14. The method of claim 1, wherein when performing the cycle, a period of performing (a) overlaps with at least a portion of a period of performing (b).

15. The method of claim 1, further comprising performing (c) before performing the cycle.

16. A substrate processing apparatus comprising:
    a process chamber in which a substrate is accommodated;
    a first precursor gas supply system configured to supply a first precursor gas containing a first element into the process chamber;
    a second precursor gas supply system configured to supply a second precursor gas, which contains the first element and has a pyrolysis temperature lower than a pyrolysis temperature of the first precursor gas, into the process chamber;

a reaction gas supply system configured to supply a reaction gas, which contains a second element that is different from the first element, into the process chamber; and a controller configured to be capable of controlling the first precursor gas supply system, the second precursor gas supply system, and the reaction gas supply system so as to perform a process including forming a film, which contains the first element and the second element, on the substrate by performing a cycle a predetermined number of times, the cycle sequentially performing:

(a) supplying the first precursor gas to the substrate in the process chamber;

(b) supplying the second precursor gas to the substrate; and (c) supplying the reaction gas to the substrate, wherein a temperature of the substrate in (a) is set to a temperature lower than a temperature at which the first precursor gas is pyrolyzed when the first precursor gas exists alone in the process chamber, and wherein a temperature of the substrate in (b) is set to a temperature higher than a temperature at which the second precursor gas is pyrolyzed when the second precursor gas exists alone in the process chamber.

17. A non-transitory computer-readable recording medium storing a program that causes, by a computer, a substrate processing apparatus to perform a process in a process chamber of the substrate processing apparatus, the process comprising:

forming a film, which contains a first element and a second element, on a substrate by performing a cycle a predetermined number of times, the cycle sequentially performing:

(a) supplying a first precursor gas containing the first element to the substrate;

(b) supplying a second precursor gas, which contains the first element and has a pyrolysis temperature lower than a pyrolysis temperature of the first precursor gas, to the substrate; and (c) supplying a reaction gas containing the second element that is different from the first element to the substrate, wherein a temperature of the substrate in (a) is set to a temperature lower than a temperature at which the first precursor gas is pyrolyzed when the first precursor gas exists alone in the process chamber, and wherein a temperature of the substrate in (b) is set to a temperature higher than a temperature at which the second precursor gas is pyrolyzed when the second precursor gas exists alone in the process chamber.

18. A substrate processing method, comprising:

forming a film, which contains a first element and a second element, on a substrate by performing a cycle a predetermined number of times, the cycle sequentially performing:

(a) supplying a first precursor gas containing the first element to the substrate in a process chamber;

(b) supplying a second precursor gas, which contains the first element and has a pyrolysis temperature lower than a pyrolysis temperature of the first precursor gas, to the substrate; and (c) supplying a reaction gas, which contains the second element that is different from the first element, to the substrate, wherein a temperature of the substrate in (a) is set to a temperature lower than a temperature at which the first precursor gas is pyrolyzed when the first precursor gas exists alone in the process chamber, and wherein a temperature of the substrate in (b) is set to a temperature higher than a temperature at which the second precursor gas is pyrolyzed when the second precursor gas exists alone in the process chamber.

* * * * *